United States Patent [19]
Murakami

[11] Patent Number: 6,069,024
[45] Date of Patent: May 30, 2000

[54] METHOD FOR PRODUCING A SEMICONDUCTOR DEVICE

[75] Inventor: Tomoo Murakami, Tokyo, Japan

[73] Assignee: NEC Corporation, Tokyo, Japan

[21] Appl. No.: 09/291,996

[22] Filed: Apr. 15, 1999

[30] Foreign Application Priority Data

Apr. 22, 1998 [JP] Japan ................................. 10-112230

[51] Int. Cl.[7] .................................................. H01L 21/44
[52] U.S. Cl. ......................... 438/108; 438/127; 438/469; 257/778
[58] Field of Search .................................. 438/108, 127, 438/469; 257/778

[56] References Cited

U.S. PATENT DOCUMENTS 5,962,925  10/1999  Eifuku ...................................... 257/778

Primary Examiner—Charles Bowers
Assistant Examiner—Nema Berezny
Attorney, Agent, or Firm—Young & Thompson

[57] ABSTRACT

The object of this invention is to provide a method whereby, during flip-chip connection using a thermosetting resin, it is possible to prevent the development of voids in the resin when the resin is hardened by pulse heating. The object is fulfilled by providing a method comprising heating a chip 4 to thereby harden a thermosetting resin 3 while applying a pressure to the chip 4 towards a substrate 1 to put a bump electrode 6 into contact with a wiring 2, wherein heating temperatures are adjusted appropriately according to:

- a first stage I of heating the thermosetting resin 3 to thereby spread it over the whole surface of substrate 1 which will carry the bump electrode 6 to thereby wet the surface with the resin 3;
- a second stage II of stimulating the gelation of thermosetting resin 3 by heating at a higher temperature than used in the first stage; and
- a third stage III of stimulating the hardening of thermosetting resin 3 by heating at a higher temperature than used in the second stage.

7 Claims, 9 Drawing Sheets

METHOD FOR PRODUCING A SEMICONDUCTOR DEVICE

BACKGROUND OF THE INVENTION

1. Field of the Invention

The present invention relates to a method for producing a semiconductor device, more particularly to a method for producing a semiconductor device whereby a semiconductor chip having bump electrodes formed thereupon is connected to a substrate via flip-chip connection using a thermosetting resin.

2. Description of the Prior Art

One of the known methods for producing a semiconductor device containing an LSI (large-scale integrated circuit) such as a memory or microprocessor includes flip-chip connection. The flip-chip connection consists of bonding a semiconductor chip diced from a semiconductor wafer fabricated through many varied processes, to a substrate which is so positioned as to direct its surface to carry electrodes downwards. According to this flip-chip connection it is easy to connect a chip with many electrodes to a substrate. Because this method does not require the use of bonding wires, accompaniment of unnecessary capacitance and inductance can be avoided, which is advantageous in improving the high-frequency characteristics of resulting semiconductor product.

The electrode on the surface of a chip which is subject to such flip-chip connection includes a spherical bump electrode made of gold, copper, solder or the like overlaid on a pad electrode of aluminum or the like which is prepared to facilitate the connection.

A publicly known conventional variation of such flip-chip connection consists of connecting a chip onto a substrate using a thermosetting resin as a bonding agent. This method consists of putting a bump electrode into contact with a wire via a force which develops when the thermosetting resin cools, to thereby establish electric connection between the two elements here concerned. The process required for this method is simple as compared with other variations that establish electric connection by melting a bump electrode, and thus requires a lower cost.

When flip-chip connection based on this method is put into practice, a heating means usually employed for hardening a thermosetting resin consists of passing pulse current through a semiconductor chip sucking tool, to thereby heat the chip. This is so-called pulse heating.

Figure 9:
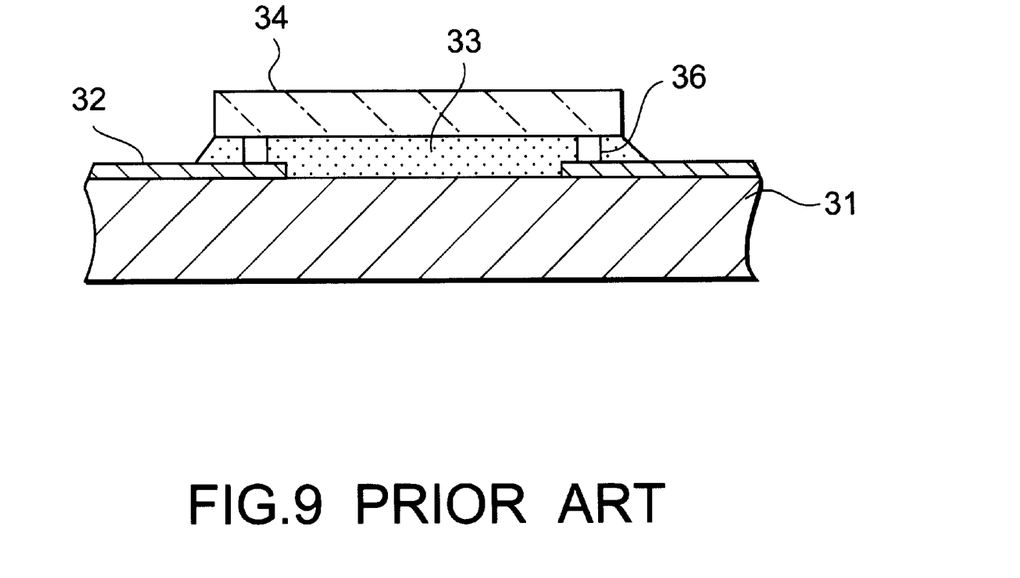
FIG. 9 is a diagram to show processes given in order necessary for a conventional method for producing a semiconductor device.
Figure 10:
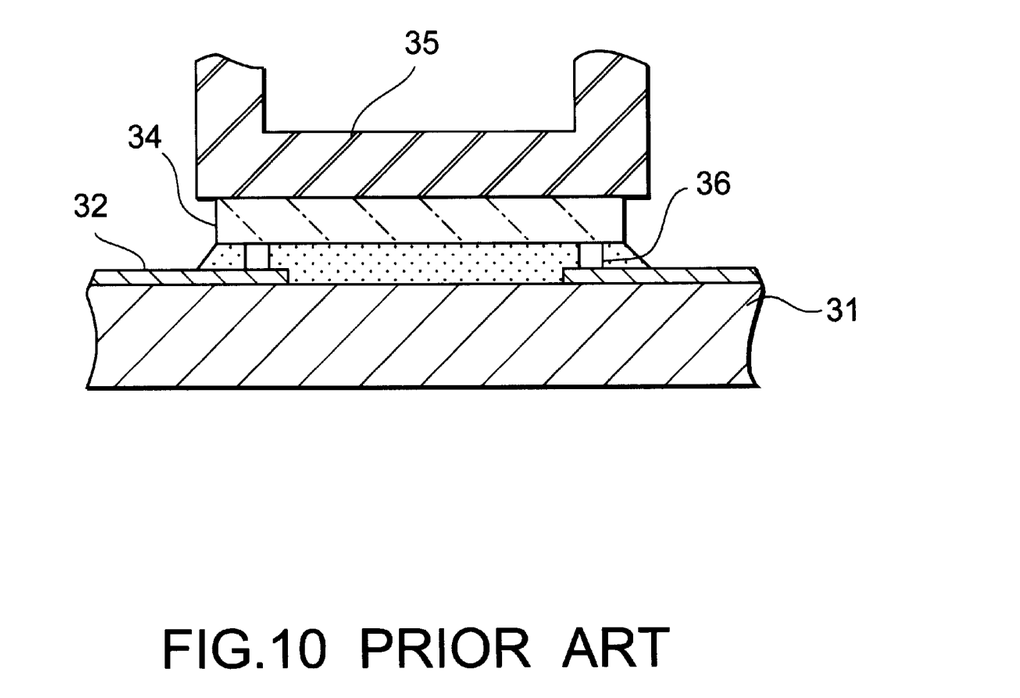
FIG. 10 is a diagram to show processes given in order necessary for the conventional method for producing a semiconductor device.
Figure 11:
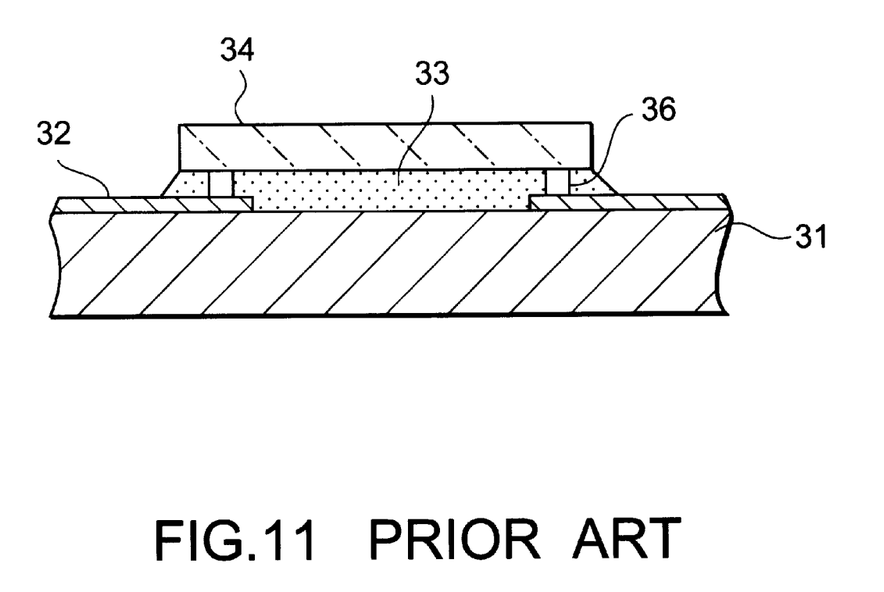
FIG. 11 is a diagram to show processes given in order necessary for the conventional method for producing a semiconductor device.

For example, Japanese Patent Laid-Open No. 63-151033 published on Jun. 23, 1998 disclosed a method for producing a semiconductor device which makes the use of flip-chip connection dependent on pulse-heating mentioned above. FIGS. 9 to 11 present the processes in order required by the method. Firstly, as shown in FIG. 9, a thermosetting resin 33 is applied onto a substrate 31 with wires 32 on areas to contact with a chip. Then, the chip 34 is sucked on its reverse side with a chip sucking tool 35 as shown in FIG. 10, and is transferred above the substrate 31, and a pressure is given on the chip 34 such that bump electrodes 36 are placed properly with respect to the wires 32. Through this process, excess thermosetting resin 33 is expelled outside in the presence of pressure, and the bump electrodes 36 and wires 32 come into contact with each other to establish electric connection.

Next, in this state, pulse current is flowed through the chip sucking tool 35 to heat the chip 34, and the thermosetting resin 33 hardens in the presence of heat. Finally, as shown in FIG. 11, the chip 34 is connected to the substrate 31 via flip-chip connection.

According to this type of pulse heating, it is possible to rapidly harden a thermosetting resin by heating it and thus to improve productivity.

However, with the method for producing a semiconductor device as described in said patent publication, hardening of a thermosetting resin by pulse heating takes place rapidly, which may readily cause the development of voids in the substance of thermosetting resin, which in turn may impair the reliability of resulting flip-chip connection.

To put it more specifically, conventionally with this method, to harden a thermosetting resin rapidly, it is usual to apply a large amount of energy capable of completing the hardening reaction rapidly. The resin, being subject to rapid hardening reaction, tends to develop foams. Further, if the energy were too large, the thermosetting resin would boil and develop bubbles itself. The bubbles developed by the resin may be entrapped in a space between the chip and substrate or a connector portion, and form voids there. A thermosetting resin containing voids may remain partially unhardened, where a sufficient contraction force will not develop to ensure stable electric connection.

The development of voids is also accounted for by the shape of the involved substrate. Namely, because a substrate has a wiring and on occasion a solder resist as appropriate formed thereupon, its surface can not help being rough. Because of this, when pulse heating is applied, while a pressure being imposed after a thermosetting resin has been applied, particularly indented portions of the rough surface may contain spaces not completely filled with the thermosetting resin. Air in those spaces expands with the rise of temperature, to develop voids.

SUMMARY OF THE INVENTION

This invention has been proposed in view of above situations, and aims at providing a method for producing a semiconductor device whereby it is possible to prevent the development of voids in a thermosetting resin during flip-chip connection, while hardening the resin by heating.

The method of this invention is applied to a semiconductor device which is obtained after a semiconductor chip having a bump electrode thereupon has been connected to a substrate with a thermosetting resin via flip-chip connection.

The method has a thermosetting resin supplying process to supply a thermosetting resin to a connector surface of a substrate which carries a wiring;

a semiconductor chip positioning process which includes sucking the semiconductor chip on its reverse side with a semiconductor chip sucking tool, transferring the chip to the substrate, and positioning the chip with respect to the substrate so as to place a bump electrode on the chip opposite to the wiring; and a semiconductor chip pressurizing and heating process which applies a pressure to the semiconductor chip towards the substrate so as to put the bump electrode into contact with the wiring while heating the semiconductor chip.

Heating temperature is changed stepwise while continuously applying the pressure on the semiconductor chip to thereby harden the thermosetting resin.

In another aspect, according to the method of this invention for producing a semiconductor chip, the heating of the semiconductor chip has a first stage of spreading a thermosetting resin over the whole surface of semiconductor chip which will carry the bump electrodes to thereby wet the surface with the resin; a second stage of heating the resin at a higher temperature than used in the first stage to thereby stimulate the gelation of thermosetting resin; and a third stage of heating the resin at a higher temperature than used in the second stage to thereby stimulate the hardening of thermosetting resin. As a further modification, the second stage of heating of the flip-chip connecting process should preferably include two sub-stages, that is, a low heating stage of heating at a low temperature and high heating stage of heating at a high temperature.

In a further aspect, according to the method of this invention for producing a semiconductor chip, a further heating of the semiconductor chip has a fourth stage of spreading the thermosetting resin over the whole surface of substrate which will carry the bump electrodes to thereby wet the surface with the resin, and to stimulate the gelation of resin; and a fifth stage of stimulating the hardening of thermosetting resin by heating at a higher temperature than used in the fourth stage.

The temperature used in the first and fourth stages should preferably be set in a range not lower than 60° C. and not higher than 100° C.

The thermosetting resin should preferably be composed of a material whose contraction coefficient during hardening is less than the thermal expansion coefficient.

DETAILED DESCRIPTION OF THE PREFERRED EMBODIMENTS

The preferred embodiments of this invention will be described below with reference to attached figures. The description will be given concretely by means of examples.

FIRST EXAMPLE

FIGS. 1 to 5 give processes constituting the method for producing a semiconductor chip representing a first example of this invention. FIG. 6 is a heating temperature distribution diagram which represents the relationship between heating time and heating temperature which are applied to harden a thermosetting resin in the method for producing a semiconductor chip of this invention.

Figure 1:
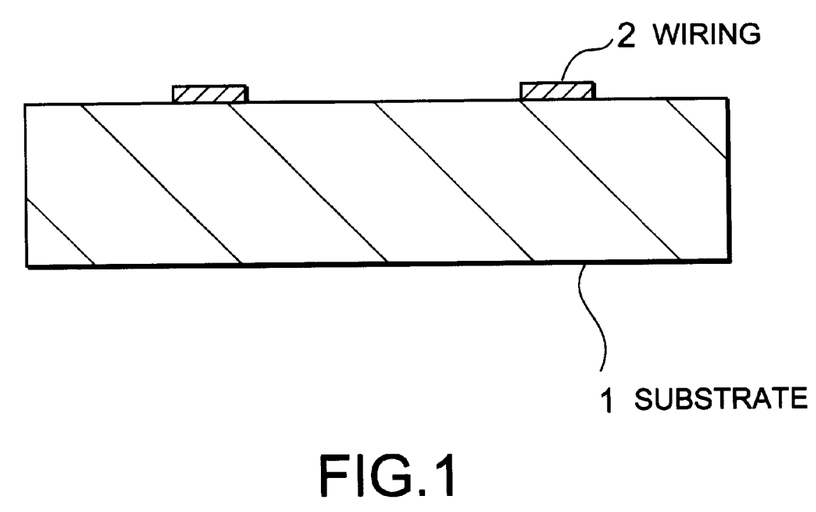
FIG. 1 is a diagram to show processes given in order necessary for the method for producing a semiconductor device representing a first example of this invention.
Figure 2:
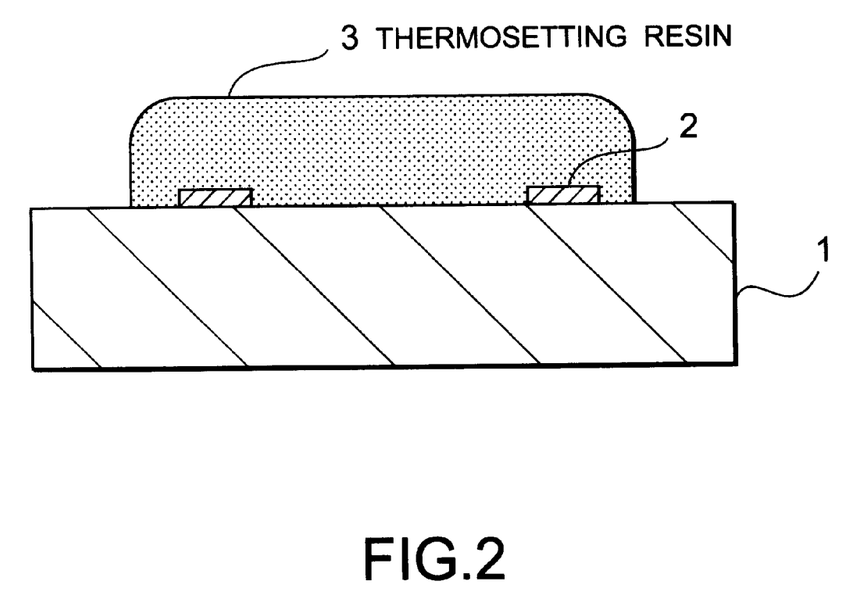
FIG. 2 is a diagram to show processes given in order necessary for the same method for producing a semiconductor device.

A substrate 1 having wirings 2 made, for example, of copper formed thereupon is used as shown in FIG. 1. A thermosetting resin 3 made, for example, of an epoxy resin is supplied, by screen printing or dispenser coating, onto a connector surface of substrate 1 which includes part of wirings 2. An epoxy resin is preferred because of its excellent feature as described below. With it, the contraction coefficient during hardening is generally larger than the thermal expansion coefficient, and thus it is scarcely torn off when it bonds a chip to a substrate via flip-chip connection, and thus stable connection is ensured.

Figure 3:
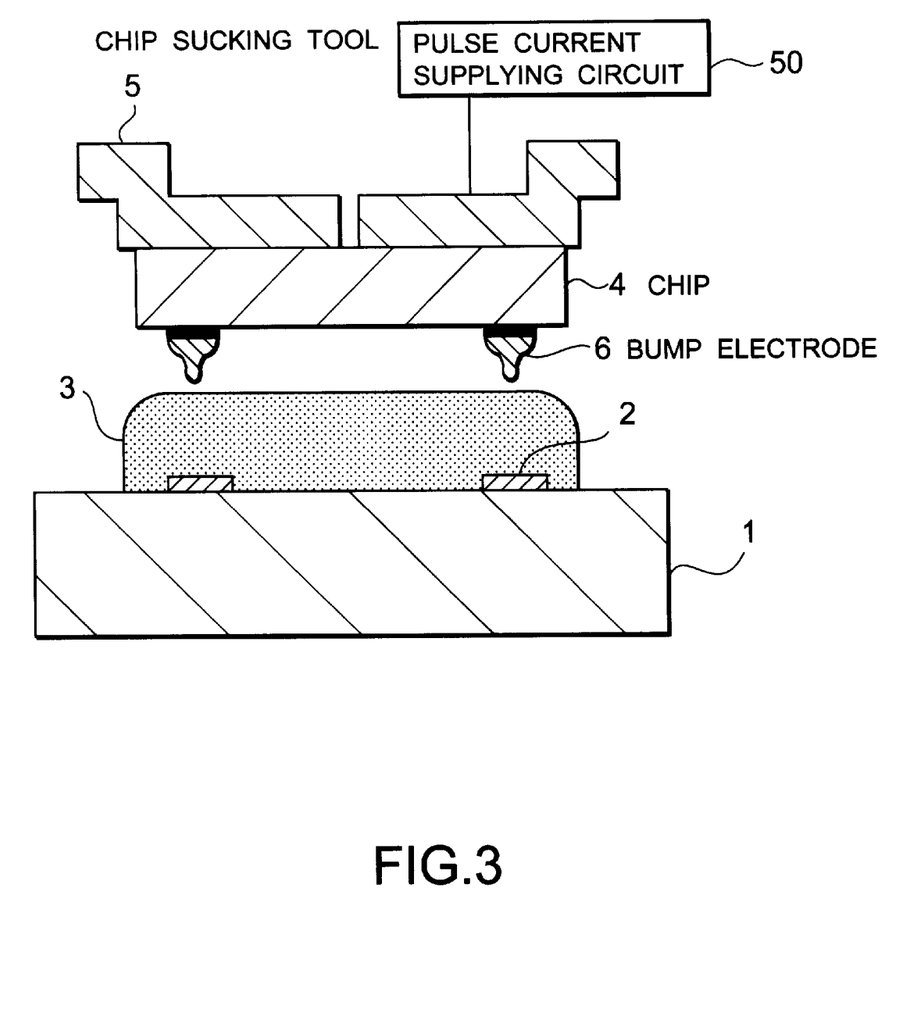
FIG. 3 is a diagram to show processes given in order necessary for the same method for producing a semiconductor device.

Next, a chip 4 having bump electrodes 6 formed thereupon is used as shown in FIG. 3. The chip 4, while being sucked on its reverse side by a chip sucking tool 5, is transferred above the substrate 1. Then, the chip 4 is adjusted in its position with respect to the substrate 1 to position the bump electrodes approximately opposite to the wirings 2. The bump electrodes 6 can be formed on chip 4, for example, by wire bonding using gold wires. During positioning, a pulse current supplying circuit 50 supplies pulse current through the chip sucking tool 5, to thereby heat the chip 4 to about 60° C. At the same time, a heater (not illustrated here) installed in a stage supporting the substrate 1 is activated to heat the substrate 1 to about 60° C. The appropriate temperatures of those elements should be determined according to the characteristics of thermosetting resin 3, or, they should be determined so as to allow the thermosetting resin to have the lowest viscosity. If, as in this example, an epoxy resin is employed as the thermosetting resin 3, temperature of about 60° C. should be preferred. The temperature in question is generally set at 100° C. or lower when other thermosetting resins are employed. The other thermosetting resins may include silicone resins, phenol resins, urethane resins, etc.

Figure 4:
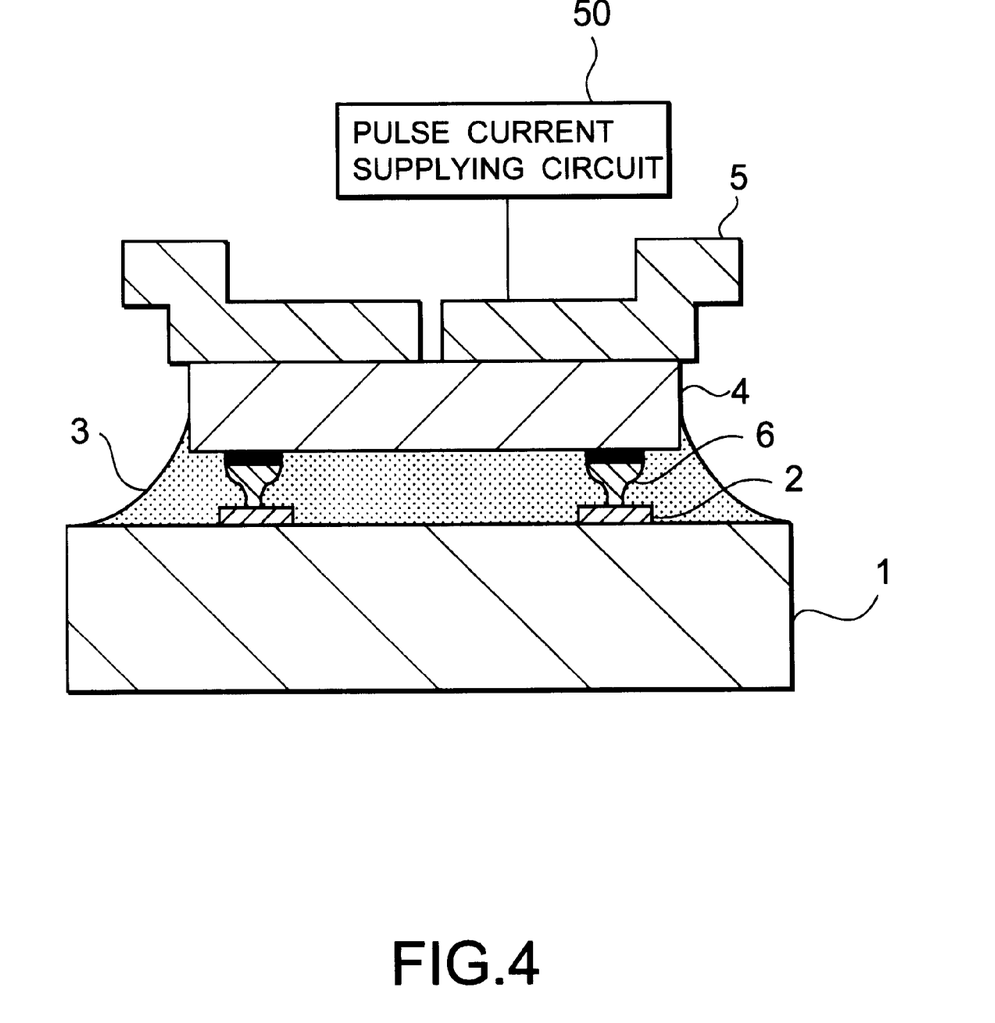
FIG. 4 is a diagram to show processes given in order necessary for the same method for producing a semiconductor device.

Then, the chip 4 is pressed against the substrate 1 by the chip sucking tool 5 so that the bump electrodes 4 come into contact with the wirings 2 while the chip 4 being heated, as shown in FIG. 4. While pressure is being given, the pulse current feed circuit 50 increases pulse current flowing through the chip sucking tool 5 stepwise so that the heating temperature changes as shown in FIG. 6. The heating temperature distribution shown in the same figure comprises three stages: a first stage I consists of heating at about 60° C. for five seconds, a second stage II of heating at about 150° C. for about five seconds, and a third stage III of heating at about 200° C. for about ten seconds.

The pressure given by the chip sucking tool 5 was set to about 30 g per one bump electrode 6.

When such a heating temperature distribution as described above is applied, pressurization during the first stage I occurs while the viscosity of thermosetting resin 3 remains the lowest, and thus the thermosetting resin 3 readily spreads over the whole surface which will carry bump electrodes 6 to wet the surface. Thus, bubbles if any will not be trapped in the thermosetting resin but expelled outside, and formation of voids will be avoided. In another aspect, because excess resin 4 is expelled by pressure, that excess resin forms a fillet around the lateral surfaces of chip 4. The fillet swells excellently because of the viscosity of resin being low, and takes a good shape.

In a further aspect, because the temperature in the second stage II is so selected as to be adequate for stimulating the gelation of thermosetting resin 3, and thus the gelation of resin 3 proceeds satisfactorily, reaction involving low molecular weight components will take place completely. Because of this, low molecular weight resin components will not remain, and thus boiling of residual low molecular weight components will be avoided, which will also contribute to the prevention of void development.

In a still further aspect, during third stage III, the temperature is set to a height most adequate for the gelation of thermosetting resin 3 after every cause possibly leading to the development of voids has been removed, and hence hardening of the resin 3 proceeds smoothly. Namely, the resin 3 will not develop bubbles during hardening because a radical hardening reaction as observed conventionally is avoided.

Figure 5:
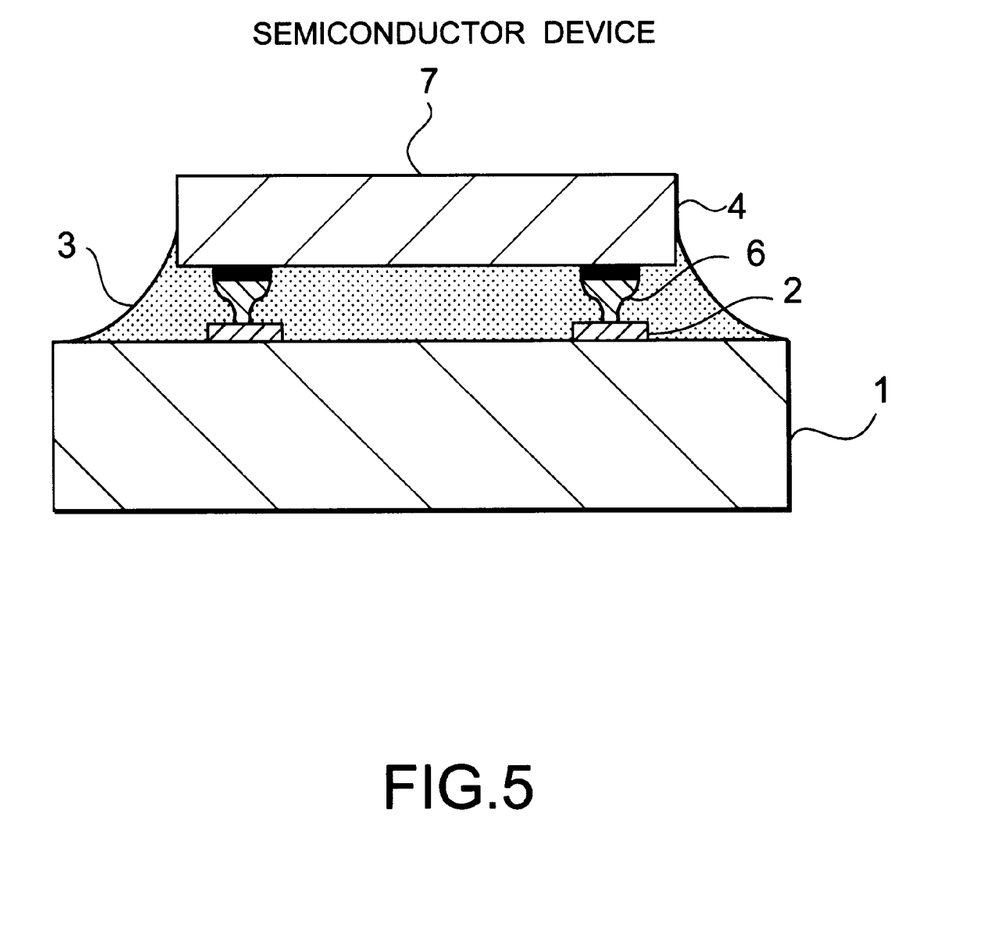
FIG. 5 is a diagram to show processes given in order necessary for the same method for producing a semiconductor device.
Figure 6:
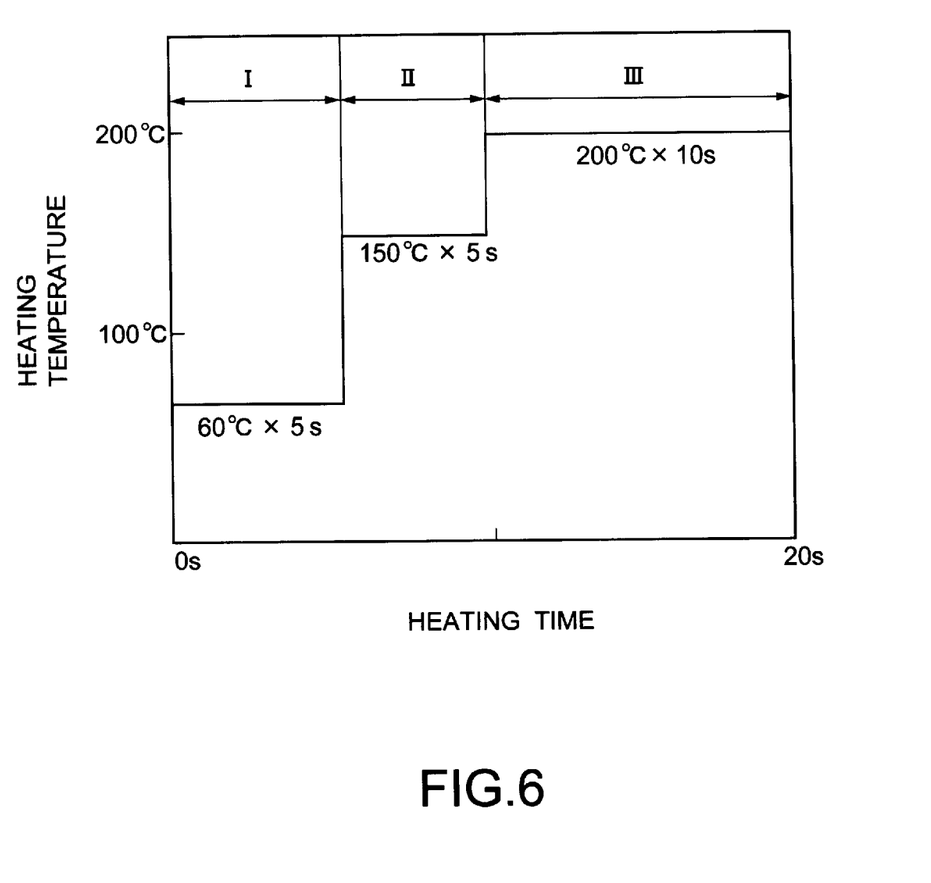
FIG. 6 is a heating temperature distribution diagram to show the relationship between the heating time and heating temperature which are applied to harden a thermosetting resin in the same method for producing a semiconductor device.

Then, the semiconductor chip 4 is released from the chip sucking tool 5 as shown in FIG. 5. Here, a semiconductor device 7 is obtained which comprises a chip 4 placed on and connected with a substrate 1 by flip-chip connection.

As seen from above, the production method represented by this example consists of hardening a thermosetting resin 3 stepwise through three stages: the first stage comprises spreading the thermosetting resin 3 over the whole surface of chip 4 which will carry bump electrodes 4 by heating to thereby wet the surface with the resin, while applying a pressure onto the chip 4 to put the bump electrodes into contact with wirings 2; the second stage comprises stimulating the gelation of the thermosetting resin 3 by heating it at a higher temperature than used in the first stage; and the third stage comprises stimulating the hardening of the thermosetting resin 3 by heating it at a higher temperature than used in the second stage. Thus, it is possible to prevent the development of voids during the thermosetting resin's hardening under pulse heating.

Therefore, because hardening of the thermosetting resin proceeds smoothly, the reliability of flip-chip connection is improved.

SECOND EXAMPLE

Figure 7:
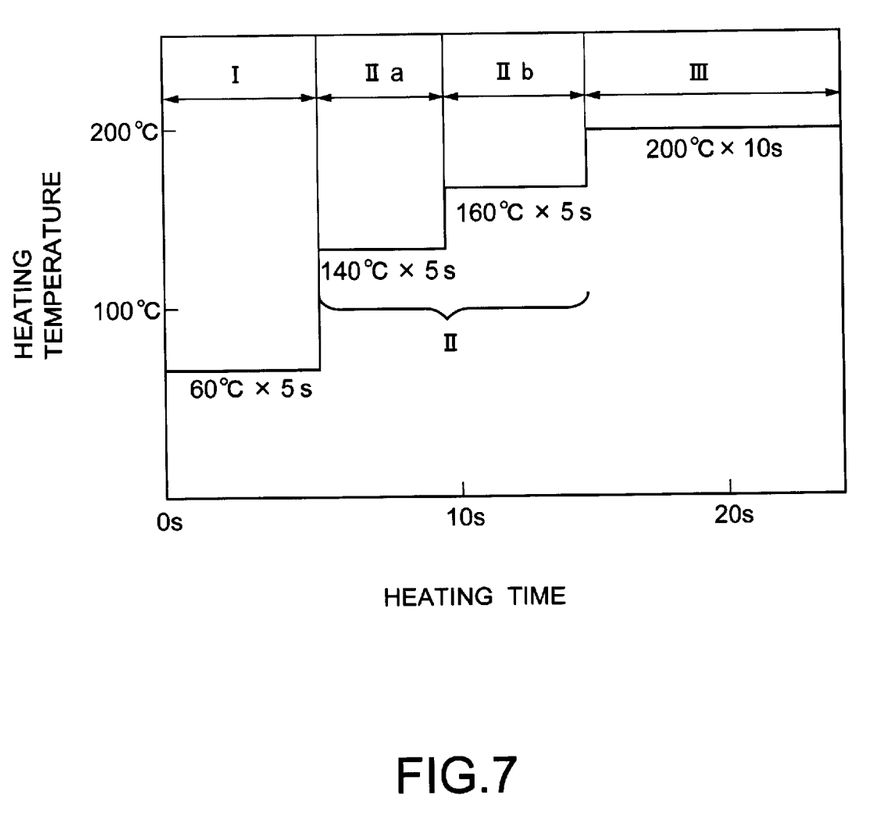
FIG. 7 is a heating temperature distribution diagram to show the relationship between the heating time and heating temperature which are applied to harden a thermosetting resin in a method for producing a semiconductor device representing a second example of this invention.

FIG. 7 is a heating temperature distribution diagram which represents the relationship between heating time and heating temperature which are applied to harden a thermosetting resin in a method for producing a semiconductor chip representing a second example of this invention.

The major different point of this method for producing a semiconductor chip representing the second example from the first example lies in that, with this method, during heating of a chip, the second stage is divided into two sub-stages: a low-heating stage IIa where heating takes place at a low temperature and a high-heating stage IIb where heating takes place at a high temperature.

Namely, the method for producing a semiconductor chip represented by this example divides the second stage necessary for stimulating the gelation of a thermosetting resin 3 into two sub-stages as shown in FIG. 7, that is, a low-heating stage IIa which consists of heating at about 140° C. for about five seconds, and a high-heating stage IIb which consists of heating at about 160° C. for about five seconds.

Because, with this embodiment, the second stage is divided into two sub-stages as seen above, it is possible to ensure the stable gelation of thermosetting resin and thus to securely remove unreacted low molecular weight components in the thermosetting resin 3.

According to the processes included in this example, the temperatures used to heat a chip are changed stepwise and allowed to distribute in the chip as such, it is possible to reproduce practically the same effect as described in the first embodiment.

In addition to above, according to this example, because the heating temperature distribution for stimulating gelation is divided into two sub-stages comprising low- and high-heating sub-stages, it is possible to stably ensure the gelation of a thermosetting resin.

THIRD EXAMPLE

Figure 8:
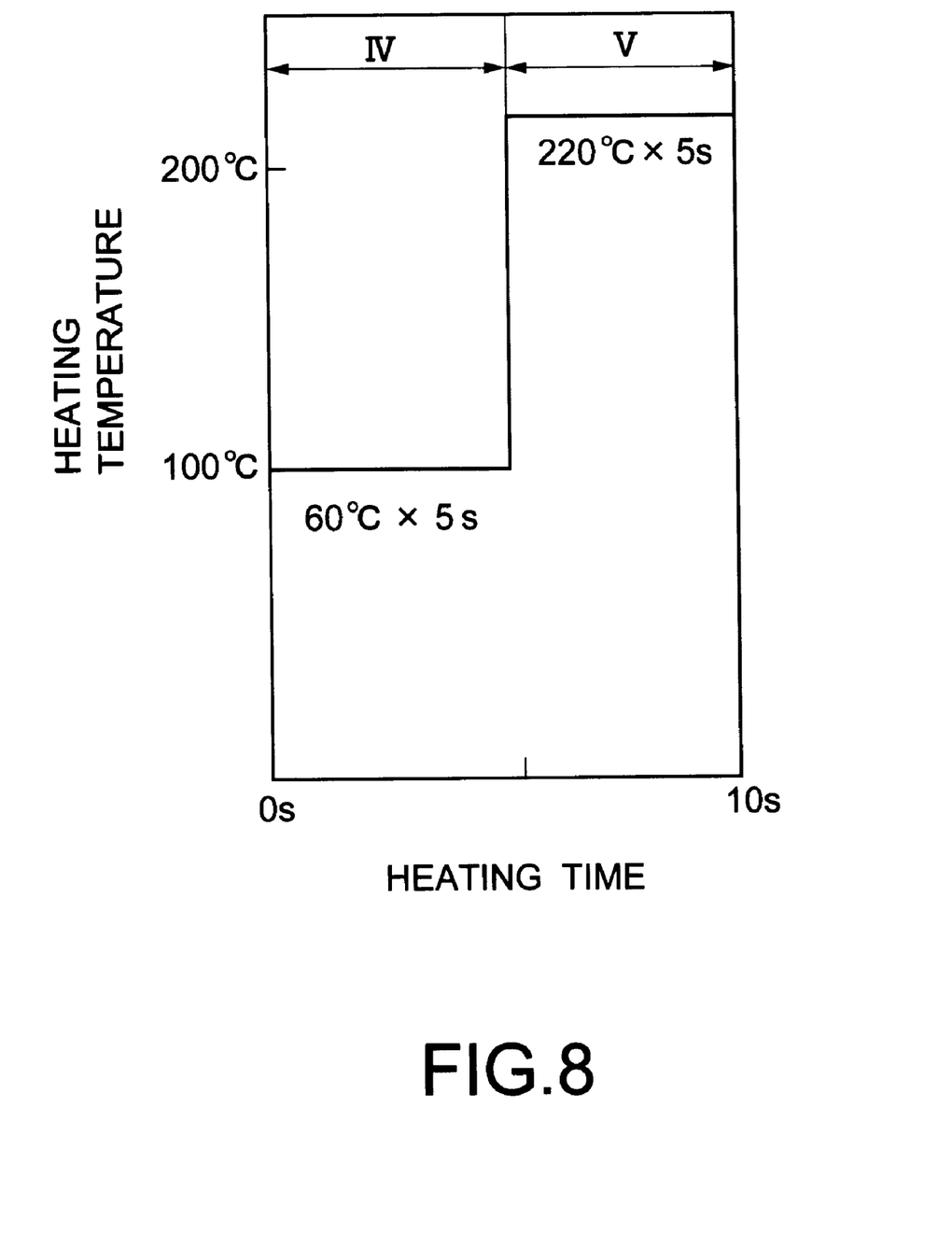
FIG. 8 is a heating temperature distribution diagram to show the relationship between the heating time and heating temperature which are applied to harden a thermosetting resin in a method for producing a semiconductor device representing a second example of this invention.

FIG. 8 is a heating temperature distribution diagram which represents the relationship between heating time and heating temperature which are applied to harden a thermosetting resin in a method for producing a semiconductor chip representing a third example of this invention.

The major different point of this method for producing a semiconductor device representing the third example from the first example lies in that, with this method, during heating of a chip, the first and second stages are united, to thereby contract the time necessary for mounting a chip.

Namely, the method for producing a semiconductor chip represented by this example includes a fourth stage IV which consists of heating at about 100° C. for about five seconds (corresponding to the first and second stages I and II of first example combined), and a fifth stage V (corresponding to the third stage III of first example).

With the heating temperature distribution as described above, the fourth stage IV allows a thermosetting resin 3 to spread over the surface of a chip which will carry bump electrodes 6, and achieves a heating to stimulate the gelation, and the fifth stage V achieves a heating to stimulate the hardening of thermosetting resin.

According to this example, it is possible to reduce the time necessary for mounting a chip half those of first and second examples. However, because energy is insufficient to completely harden the entire mass of thermosetting resin 3, it would be desirable to compensate for the shortage of energy by subjecting, subsequent to the flip-chip connecting step, the semiconductor device to a baking treatment at about 150° C. for about one hour.

Because, as also seen from this example, temperatures used to heat a chip are changed stepwise and are allowed to distribute in the chip as such, it is possible to reproduce practically the same effect as described in the first embodiment.

Examples of this invention have been described in detail above with reference to attached figures, but concrete production methods should not be limited to those examples. Thus, any modifications applied to the designing of the present method will be included in this invention, as long as they do not overstep the concept of this invention. For example, heating temperatures and times represented here are given as an illustration, and they may be changed according to given purposes and applications without overstepping the concept of this invention.

Further, the materials of bump electrodes of a chip and of wires of a substrate may not be limited to gold and copper, but they may include any conductive materials such as silver, aluminum, solder alloy or the like.

Furthermore, the thermosetting resin may not be limited to an epoxy resin, but include other materials such as silicone resin, phenol resin, urethane resin or the like.

Still further, although the temperature used in the first stage is set to about 60° C. in the first example described above, the temperature may not be limited to this range, but take any value as long as the temperature falls in the range of not lower than 60° C. and not higher than 100° C., which will ensure the reproduction of the same effect as described in the first example.

Likewise, although the temperature of fourth stage is set to about 100° C. in the second example described above, this may not be limited to this but take any value as long as it falls in the range of not lower than 60° C. and not higher than 100° C. which will ensure the reproduction of the same effect as described in the second example.

As described above, according to the method of this invention for producing a semiconductor device, because heating temperatures are changed stepwise according to different stages, while a pressure is being applied to a chip to put bump electrodes into contact with wirings, it becomes possible to prevent the development of voids during the hardening of thermosetting resin by pulse heating.

Thus, because the hardening of a thermosetting resin proceeds satisfactorily, the reliability of flip-chip connection is improved.

What is claimed is:

1. A method for producing a semiconductor device which is obtained after a semiconductor chip having a bump electrode formed thereupon is connected via flip-chip connection onto a substrate with a thermosetting resin comprises:

supplying a thermosetting resin to a connector surface of a substrate which carries a wiring;

a semiconductor chip positioning process which includes sucking the semiconductor chip on its reverse side with a semiconductor chip sucking tool, transferring the chip to the substrate, and positioning the chip with respect to the substrate so as to place the bump electrode practically opposite to the wiring of the substrate; and applying a pressure to the semiconductor chip towards the substrate so as to put the bump electrode into contact with the wiring while heating the semiconductor chip by changing heating temperatures stepwise to thereby harden the thermosetting resin.

2. A method as described in claim 1 for producing a semiconductor device wherein the heating of the semiconductor chip by changing heating temperatures stepwise comprises:

a first stage of spreading the thermosetting resin over the whole surface of semiconductor chip which will carry the bump electrode to thereby wet the surface with the resin;

a second stage of heating the resin at a higher temperature than used in the first stage to thereby stimulate the gelation of thermosetting resin; and a third stage of heating the resin at a higher temperature than used in the second stage to thereby stimulate the hardening of thermosetting resin.

3. A method as described in claim 2 for producing a semiconductor device wherein the second stage comprises a low-temperature heating and a high-temperature heating.

4. A method as described in claim 1 for producing a semiconductor chip wherein the heating of the semiconductor chip by changing heating temperatures stepwise further comprises:

a fourth stage of spreading the thermosetting resin over the whole surface of substrate which will carry the bump electrode to thereby wet the surface with the resin, and to stimulate gelation of the resin; and a fifth stage of stimulating the hardening of thermosetting resin by heating at a higher temperature than used in the fourth stage.

5. A method as described in claim 4 for producing a semiconductor device wherein the temperature used in the fourth stage is set in the range not lower than 60° C. and not higher than 100° C.

6. A method as described in any claim 1 for producing a semiconductor device wherein heating of the semiconductor chip takes place by passing pulse current through the semiconductor chip sucking tool.

7. A method as described in claim 1 for producing a semiconductor chip wherein the thermosetting resin is made of a material whose contraction coefficient during hardening is larger than the thermal expansion coefficient.

* * * * *